(12) United States Patent
Ito

(10) Patent No.: US 7,571,993 B2
(45) Date of Patent: Aug. 11, 2009

(54) INK-JET HEAD

(75) Inventor: Hirosumi Ito, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 186 days.

(21) Appl. No.: 11/275,791

(22) Filed: Jan. 30, 2006

(65) Prior Publication Data
US 2006/0170737 A1 Aug. 3, 2006

(30) Foreign Application Priority Data
Jan. 31, 2005 (JP) ............................... 2005-023858

(51) Int. Cl.
*B41J 2/045* (2006.01)
(52) U.S. Cl. .......................................... 347/71; 347/68
(58) Field of Classification Search ............... 347/70, 347/71–72, 50
See application file for complete search history.

(56) References Cited

U.S. PATENT DOCUMENTS 6,796,638 B2 * 9/2004 Koike et al. ................. 347/70

2003/0156157 A1 8/2003 Suzuki et al.
2004/0113994 A1 * 6/2004 Shinkai ....................... 347/68

FOREIGN PATENT DOCUMENTS

| JP | 1996274211 A | 10/1996 |
| JP | 2002269394 A | 9/2000 |
| JP | 2003311953 A | 11/2003 |

* cited by examiner

*Primary Examiner*—Matthew Luu
*Assistant Examiner*—Lisa M Solomon
(74) *Attorney, Agent, or Firm*—Baker Botts L.L.P.

(57) ABSTRACT

An ink-jet head comprises a piezoelectric actuator including a piezoelectric layer, individual electrodes respectively corresponding to ink ejection channels and formed on a surface of the piezoelectric layer, lands formed on the surface of the piezoelectric layer so as to be electrically connected to the respective individual electrodes, and a common electrode opposed to the individual electrodes with the piezoelectric layer being interposed therebetween. A height of the land from the surface of the piezoelectric layer is larger than a height of the individual electrode from the surface of the piezoelectric layer. The land has a hole opening in its top face which is remote from the piezoelectric layer.

10 Claims, 12 Drawing Sheets

US 7,571,993 B2

INK-JET HEAD

BACKGROUND OF THE INVENTION

1. Field of the Invention

The present invention relates to an ink-jet head which ejects ink to a record medium.

2. Description of Related Art

An ink-jet head included in an ink-jet printer or the like distributes to pressure chambers ink supplied by an ink tank, and selectively applies pulsed pressure to each of the pressure chambers so that ink is ejected through nozzles communicating with the respective pressure chambers. An actuator unit in which piezoelectric sheets made of a piezoelectric ceramic are put in layers may be employed as a means for selectively applying pressure to the pressure chambers.

This type of ink-jet head is exemplified by one which has an actuator unit including a piezoelectric sheet that extends over pressure chambers, individual electrodes that correspond to the respective pressure chambers, and a common electrode that is opposed to the individual electrodes with the piezoelectric sheet interposed therebetween (see Japanese Patent Unexamined Publication No. 2003-311953). Each of the individual electrodes includes a main electrode portion and an auxiliary electrode portion, and is electrically connected to a flexible printed circuit (FPC) configured as a wiring board. The main electrode portion is formed at a position opposed to a corresponding pressure chamber. The auxiliary electrode portion receives voltage from the outside. The FPC has terminals respectively corresponding to the auxiliary electrode portions. Each terminal is bonded to a corresponding auxiliary electrode portion with a solder.

SUMMARY OF THE INVENTION

In a case where pressure chambers are arranged at a high density in order to meet a demand for a high-resolution image and a high-speed printing, spacing between individual electrodes is small. If the pressure chambers of the aforementioned ink-jet head are arranged at a high density, a solder used for bonding an auxiliary electrode portion to a terminal of the FPC may overflow around from the auxiliary electrode portion and come into contact with a neighboring individual electrode, which undesirably causes a short circuit.

An object of the present invention is to provide an ink-jet head capable of suppressing a short circuit which may otherwise be caused by a conductive member such as a solder coming into contact with other individual electrodes.

According to a first aspect of the present invention, there is provided an ink-jet head comprising a piezoelectric actuator including a piezoelectric layer, a plurality of individual electrodes respectively corresponding to ink ejection channels and formed on a surface of the piezoelectric layer, a plurality of lands formed on the surface of the piezoelectric layer so as to be electrically connected to the respective individual electrodes, and a common electrode opposed to the individual electrodes with the piezoelectric layer being interposed therebetween. A height of the land from the surface of the piezoelectric layer is larger than a height of the individual electrode from the surface of the piezoelectric layer, and the land has a hole opening in its top face which is remote from the piezoelectric layer.

In this first aspect, at the time when a land is bonded to a terminal of a wiring board with a conductive member which is applied to a top face of the land, the conductive member flows into a hole of the land and does not so easily overflow around the land. This leads to suppression of a short circuit which may otherwise be caused by the conductive member coming into contact with other individual electrodes.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS

In the following, some preferred embodiments of the present invention will be described with reference to the accompanying drawings.

Figure 1:
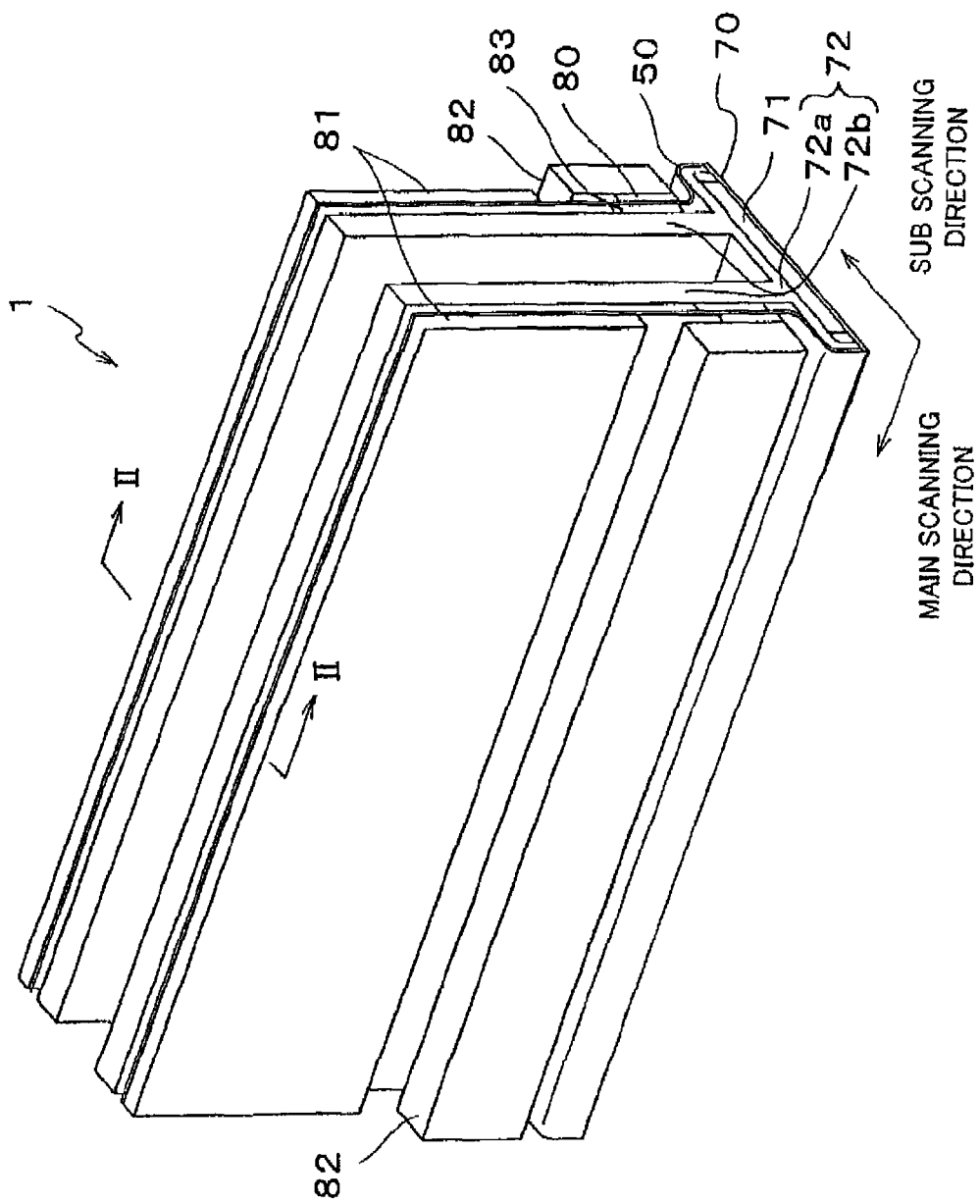
FIG. 1 is a perspective view of an appearance of an ink-jet head according to a first embodiment of the present invention.
Figure 2:
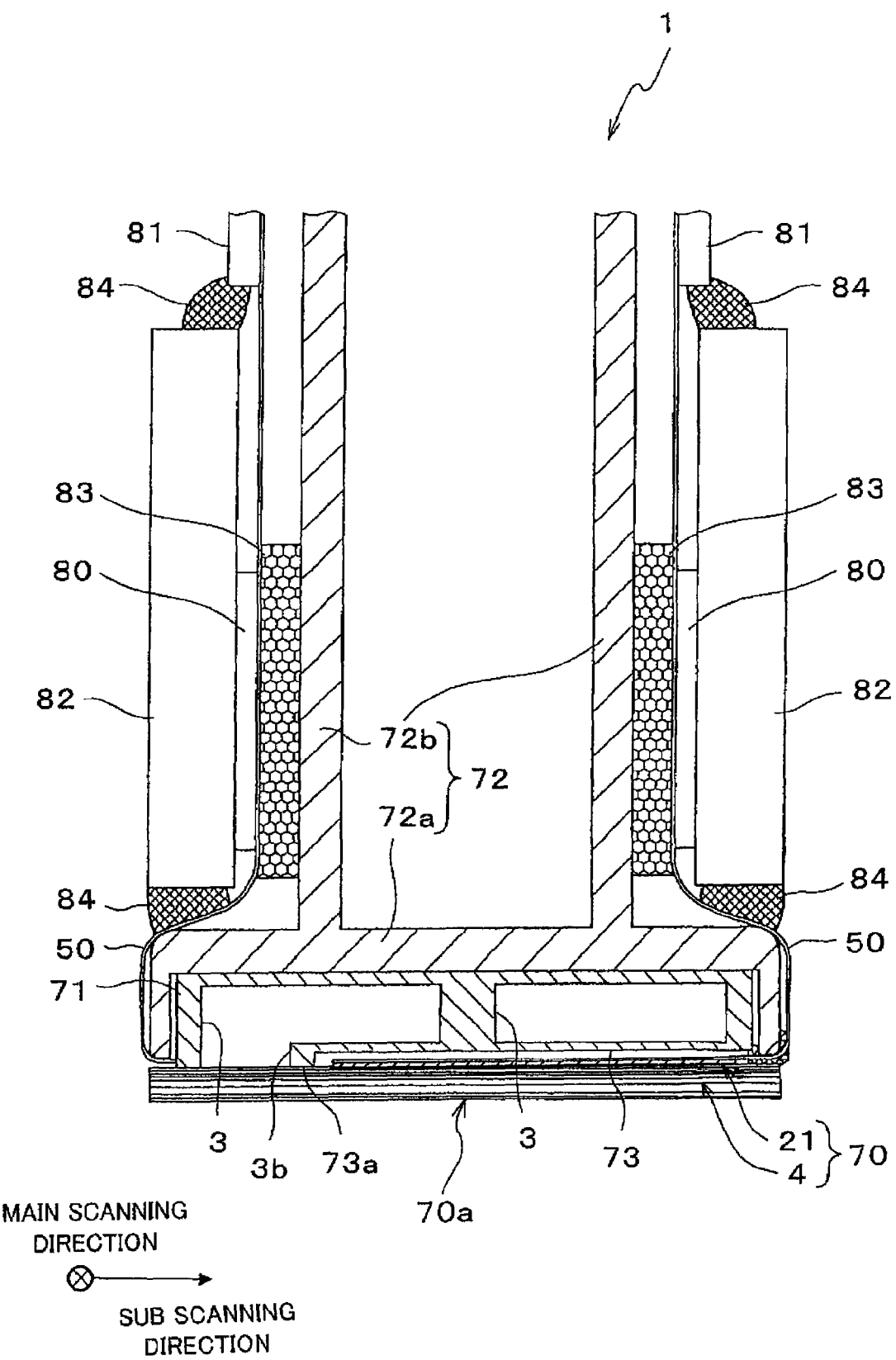
FIG. 2 is a sectional view as taken along a line II-II of FIG. 1.

As shown in FIGS. 1 and 2, an ink-jet head 1 according to a first embodiment of the present invention includes a head main body 70, a reservoir unit 71, a holder 72, and a flexible printed circuit board (FPC) 50. The head main body 70 has, on its lower face, an ink ejection face 70a. The reservoir unit 71 is put on an upper face of the head main body 70, and reserves therein ink which will be supplied to the head main body 70. The holder 72 holds the reservoir unit 71. The FPC 50 transmits a drive signal outputted from a driver IC 80 to an actuator unit 21 of the head main body 70.

As shown in FIG. 2, the head main body 70 includes a passage unit 4 having ink passages formed therein, and four actuator units 21.

Figure 3:
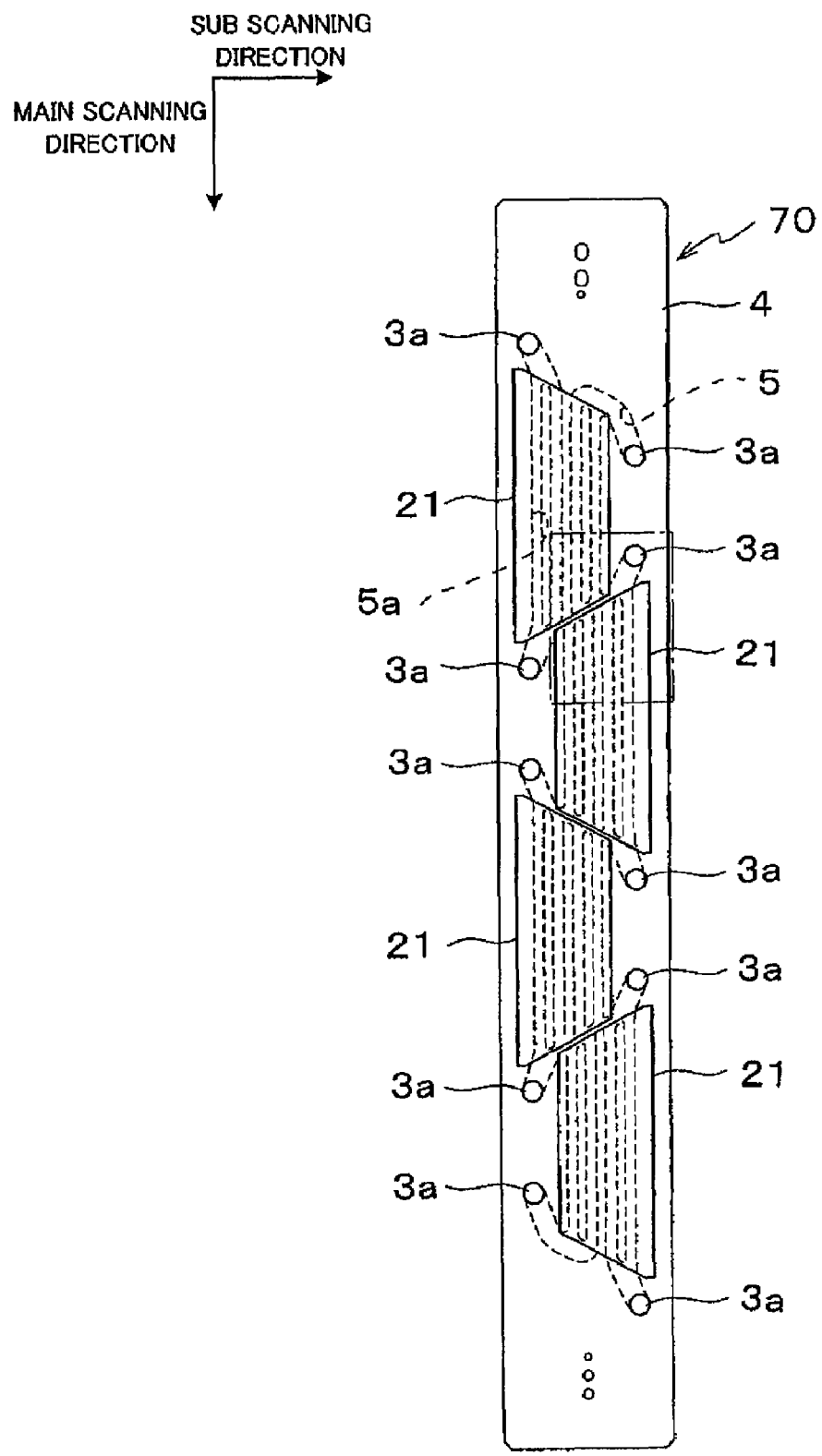
FIG. 3 is a plan view of a head main body that is included in the ink-jet head.

In a plan view, as shown in FIG. 3, the passage unit has a rectangular shape extending in a main scanning direction. An upper face of the passage unit 4 has ten openings 3a in total, which locate away from the actuator units 21. The ten openings 3a are arranged in two rows each including five openings 3a and extending along the main scanning direction. Manifold channels 5 which communicate with the respective openings 3a are formed inside the passage unit 4. Each of the manifold channels 5 branches into sub-manifold channels 5a which extend in the main scanning direction. Ink reserved within the reservoir unit 71 is supplied through the openings 3a to the manifold channels 5 and then to the sub manifold channels 5a.

The four actuator units 21, each having a trapezoidal shape in a plan view, are arranged in a zigzag pattern with their upper and lower sides being in parallel with the main scanning direction. The four actuator units 21 are bonded to the upper face of the passage unit 4 with an epoxy-base thermosetting adhesive. Oblique sides of every neighboring actuator units 21 overlap each other with respect to the sub scanning direction.

Figure 4:
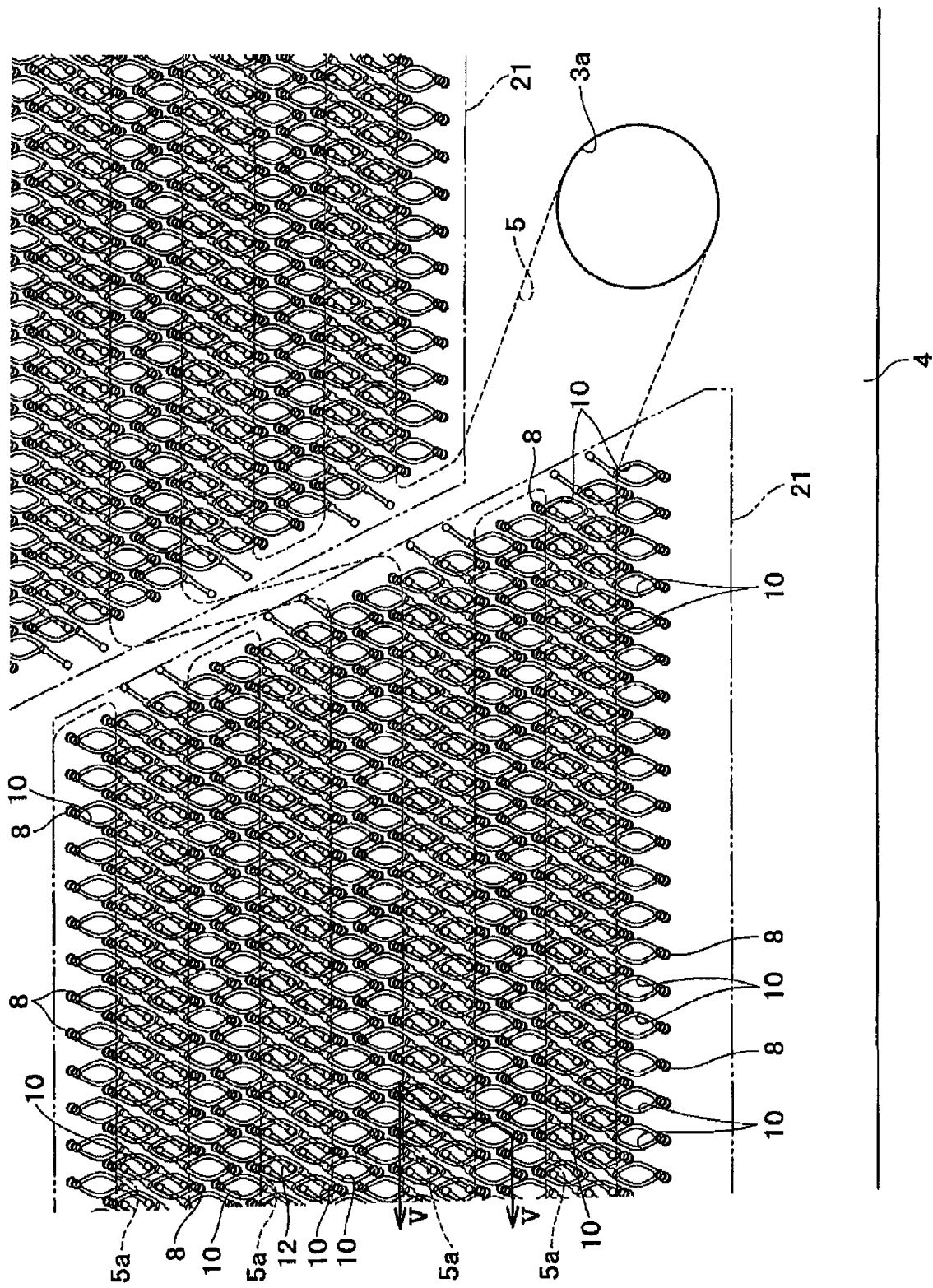
FIG. 4 is an enlarged view of a region enclosed with an alternate long and short dash line in FIG. 3.

On the ink ejection face 70a which means the lower face of the passage unit 4, many nozzles 8 each having a small diameter are arranged in a matrix within regions corresponding to where the actuator units 21 are bonded (see FIG. 4). On the upper face of the passage unit 4, pressure chambers 10 respectively corresponding to the nozzles 8 are arranged in a matrix within regions to which the actuator units 21 are bonded. The pressure chamber 10 has a substantially rhombic shape in a plan view. In FIG. 4, for the purpose of easy understanding, pressure chambers 10, apertures 12, and nozzles 8 are illustrated with solid lines though they should be illustrated with broken lines because they locate below the actuator unit 21.

Referring again to FIG. 2, the reservoir unit 71 will be described. The reservoir unit 71 is made of a metallic material such as a stainless steel. Formed within the reservoir unit 71 are two parallel ink reservoirs 3 that extend along the main scanning direction. The ink reservoir 3 is a hollow region of substantially rectangular parallelepiped, and always filled up with ink because ink is supplied thereto from an external ink tank (not shown) via an opening (not shown) that communicates with the ink reservoir 3. A lower face 73 of the reservoir unit 71 has openings 3b which respectively correspond to the openings 3a of the passage unit 4 and communicate with the ink reservoir 3. Ink reserved in the ink reservoir 3 is supplied through the openings 3b to the passage unit 4.

A wall enclosing the opening 3b protrudes downward and thus forms a protrusion 73a. Of the reservoir unit 71, only the protrusions 73a are in contact with the head main body 70. To be more specific, the protrusions 73a are attached to the upper face of the passage unit 4 in such a manner that the openings 3b are aligned with the openings 3a formed in the upper face of the passage unit 4. A region of the lower face 73 of the reservoir unit 71 except the protrusions 73a is spaced away from the head main body 70. The actuator units 21 are disposed in this space.

As shown in FIG. 2, the holder 72 includes a gripper 72a and a pair of protrusions 72b. The gripper 72a grips the reservoir unit 71. The pair of protrusions 72b protrudes upward from an upper face of the gripper 72a. A concavity is formed in a lower face of the gripper 72a of the holder 72A. A base block 71 is fixed within the concavity and bonded in this state.

The FPC 50 is bonded to an upper face of each actuator unit 21. The FPC 50 extends out to a side face of the gripper 72a, then extends upward while bent along a shape of the gripper 72a, and further extends along a surface of the protrusion 72b of the holder 72 with an elastic member 83 such as sponge being interposed therebetween. The driver IC 80 is mounted on a face of the FPC 50 opposite to its face having the elastic member 83. The driver IC 80 is electrically connected to the FPC 50.

For the purpose of efficient dissipation of heat generated in the driver IC 80, a heat sink 82 having a substantially rectangular parallelepiped shape is mounted on a face of the driver IC 80 opposite to its face attached to the FPC 50. Above the driver IC 80 and the heat sink 82, a substrate 81 is attached to the FPC 50. Sealer 84 bind an upper face of the heat sink 82 to the substrate 81, and a lower face of the heat sink 82 to the FPC 50, respectively.

Next, the passage unit 4 will be described in details.

As shown in FIG. 3, four sub-manifold channels 5a in total extend in a region of the passage unit 4 corresponding to each actuator unit 21. Many individual ink passages 7, each of which extends through an aperture 12 and a pressure chamber 10 to a nozzle 8 (see FIG. 5), are connected to each sub manifold channel 5a. The individual ink passages 7 are formed so as to correspond to the respective nozzles 8.

Figure 5:
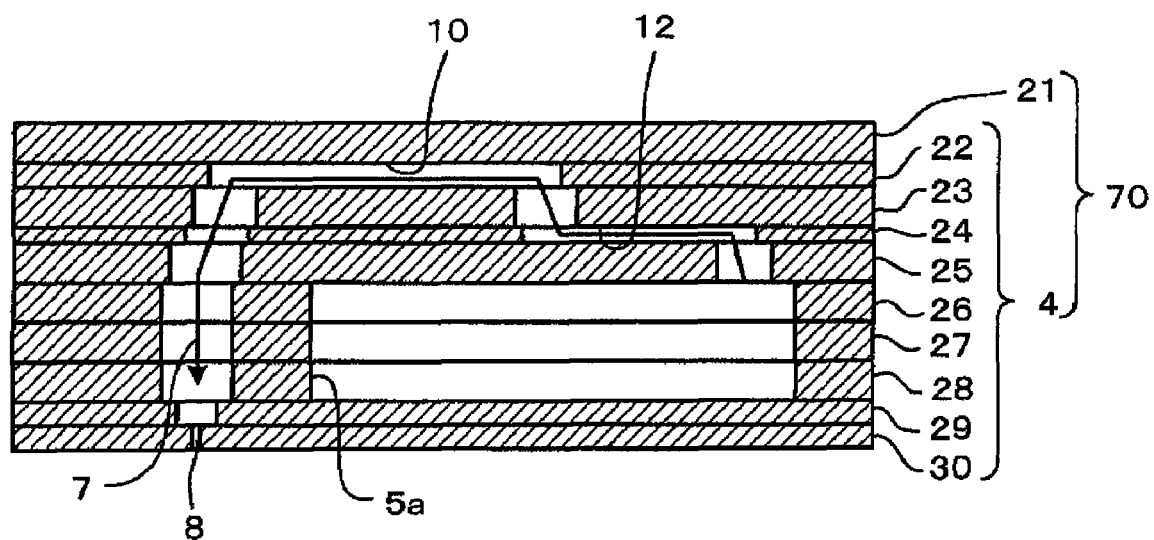
FIG. 5 is a sectional view as taken along a line V-V of FIG. 4.

As shown in FIG. 5, the passage unit 4 has a layered structure of a total of nine plates, i.e., a cavity plate 22, a base plate 23, an aperture plate 24, a supply plate 25, manifold plates 26, 27, 28, a cover plate 29, and a nozzle plate 30.

The cavity plate 22 is a metal plate in which formed are many substantially rhombic openings that serve as pressure chambers 10. The base plate 23 is a metal plate in which formed are connection holes each connecting a pressure chamber 10 to a corresponding aperture 12 and connection holes each connecting a pressure chamber 10 to a corresponding nozzle 8. The aperture plate 24 is a metal plate in which formed are holes that serve as apertures 12 and connection holes each connecting a pressure chamber 10 to a corresponding nozzle 8. The supply plate 25 is a metal plate in which formed are connection holes each connecting an aperture 12 to a sub-manifold channel 5a and connection holes each connecting a pressure chamber 10 to a corresponding nozzle 8. Each of the manifold plates 26, 27, and 28 is a metal plate in which formed are holes that constitute sub-manifold channels 5a and connection holes each connecting a pressure chamber 10 to a corresponding nozzle 8. The cover plate 29 is a metal plate in which formed are connection holes each connecting a pressure chamber 10 to a corresponding nozzle 8. The nozzle plate 30 is a metal plate in which nozzles 8 are formed.

All of the plates 22 to 30 are made of SUS430 for example, and positioned to one another and put in layers such that the individual ink passages 7 as shown in FIG. 5 are formed therein. The individual ink passage 7 firstly extends upward from the sub-manifold channel 5a, then extends horizontally in the aperture 12, then further extends upward, then again extends horizontally in the pressure chamber 10, then extends obliquely downward in a certain length away from the aperture 12, and then extends vertically downward toward the nozzle 8.

As clearly seen from FIG. 5, the pressure chambers 10 and the apertures 12 locate at different levels from each other with respect to a direction of lamination of the plates 22 to 30. Therefore, as shown in FIG. 4, an aperture 12 which communicates with one pressure chamber 10 can be disposed at a position overlapping in a plan view another pressure chamber 10 that neighbors the aforesaid one pressure chamber 10. As a result, the pressure chambers 10 can be arranged at a high density, and therefore downsizing of the ink-jet head 1 and a high-resolution printing can be achieved.

Next, the actuator unit 21 will be described in details.

Figure 6A:
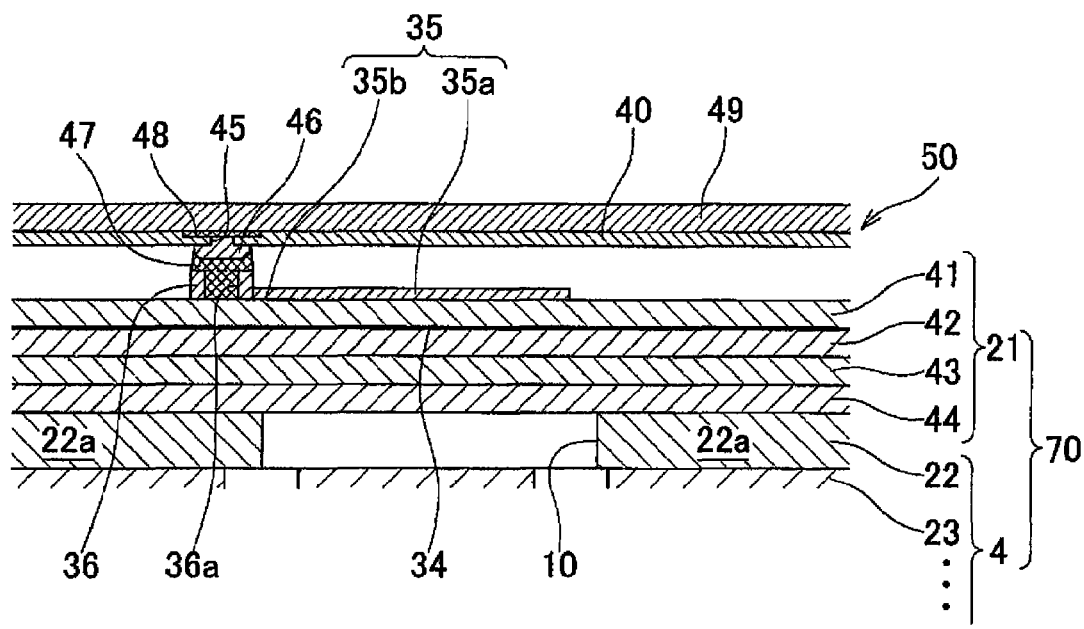
FIG. 6A is a local sectional view showing a bonding between an actuator unit and an FPC included in the ink-jet head.

As shown in FIG. 6A, the actuator unit 21 includes four piezoelectric sheets 41, 42, 43, and 44, a common electrode 34, and individual electrodes 35. Each of the four piezoelectric sheets 41, 42, 43, and 44 has a trapezoidal shape identical to a configuration of the actuator unit 21 shown in FIG. 3. The common electrode 34 has a thickness of approximately 2 μm, and is formed between the piezoelectric sheets 41 and 42 throughout a surface of each of these sheets. The individual electrodes 35 are formed on an upper face of the piezoelectric sheet 41 such that their positions correspond to the respective pressure chambers 10. The individual electrodes 35 and the common electrode 34 . . .

Each of the piezoelectric sheets 41 to 44 has a thickness of approximately 15 μm, and made of a lead zirconate titanate (PZT)-base ceramic material having ferroelectricity. As shown in FIG. 4, the piezoelectric sheets 41 to 44 which constitute the actuator unit 21 cover many pressure chambers 10.

The common electrode 34 is made of a metallic material such as an Ag—Pd-base one, and grounded in a not-shown region. Thus, the common electrode 34 is, in a region thereof corresponding to any pressure chamber 10, equally kept at a constant potential which means the ground potential in this embodiment.

Figure 6B:
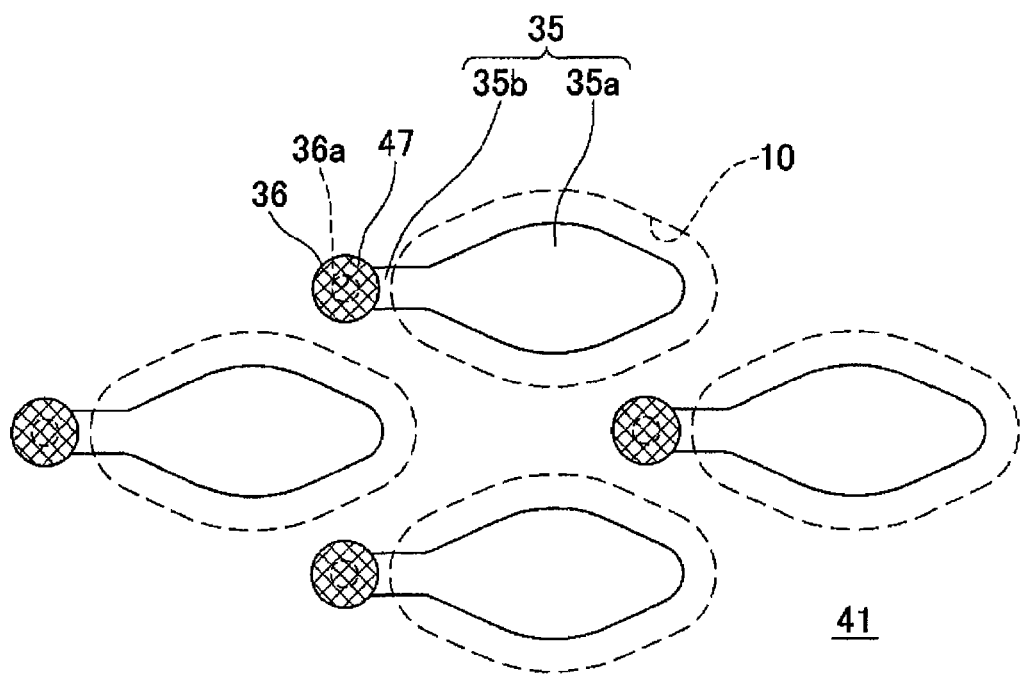
FIG. 6B is a plan view of individual electrodes that are formed on the actuator unit.

The individual electrodes 35 are made of the same material as that of the common electrode 34. The individual electrodes 35 are, like the pressure chambers 10, formed in a matrix at a high density using, e.g., a screen printing technique. As shown in FIG. 6B, each of the individual electrodes 35 includes a main electrode portion 35a and an auxiliary electrode portion 35b. A shape of the main electrode portion 35a is substantially the same as that of the pressure chamber 10 but somewhat smaller than that of the pressure chamber 10. The auxiliary electrode portion 35b is continuous with the main electrode portion 35a, and formed by extending out an acute portion of the main electrode portion 35a to a position not opposed to the pressure chamber 10. A land 36 of substantially column shape is connected to an end of the auxiliary electrode portion 35b.

The land 36 is made of, e.g., gold including grass frits, and electrically connected to the auxiliary electrode portion 35b. As shown in FIG. 6A, the land 36 locates at a position corresponding to a wall 22a of the cavity plate 22 which defines the pressure chamber 10. A thickness of the land 36 is substantially three times the thickness of the individual electrode 35. Therefore, a distance between an upper face of the land 36 and the upper face of the piezoelectric sheet 41 is larger than a distance between an upper face of the individual electrode 35 and the upper face of the piezoelectric sheet 41. The land 36 has a hole 36a at its center. The hole 36a penetrates through the land 36 in a direction perpendicular to the upper face of the piezoelectric sheet 41, that is, in a thickness direction. A bottom of the hole 36a is closed with the piezoelectric sheet 41, and a top of the hole 36a is left opened.

A position of each land 36 corresponds to the wall 22a of the cavity plate 22 which defines the pressure chambers 10. Accordingly, when, as will be detailed later, a terminal 46 is pressed onto the land 36 in order to bond the FPC 50 to the head main body 70, the piezoelectric sheets 41 to 44 are not damaged by pressing force applied to the land 36.

As shown in FIG. 6B, the individual electrodes 35 and the lands 36 are regularly arranged such that they are spaced apart from neighboring individual electrodes 35 and the lands 36 at regular intervals.

Next, the FPC 50 will be described in details.

As shown in FIG. 6A, the FPC 50 includes a base film 49, many wirings 48 made of copper, and a cover film 40. The other end of each wiring 48 is electrically connected to the driver IC 80. The cover film 40 covers a whole of a lower face of the base film 49. The cover film 40 has through holes 45 that correspond to the respective lands 36. The base film 49 and the cover film 40 are positioned to each other and put in layers with the wirings 48 being sandwiched therebetween, such that each through hole 45 corresponds to one end of a corresponding wiring 48 and at the same time a periphery of the one end of each wiring 48 is covered with the cover film 40.

The base film 49 and the cover film 40 are insulative films. For example, the base film 49 is made of a polyimide resin, and the cover film 40 is made of a photosensitive material. If the cover film 40 is made of a photosensitive material, the through holes 45 can easily be formed.

A terminal 46 of the FPC 50 is provided at each through hole 45, so that the terminal 46 is in contact with one end of a corresponding wiring 48 via this through holes 45. The terminal 46 is made of a conductive material such as nickel. The terminal 46 closes the through hole 45, and at the same time covers the periphery of the through hole 45 on a lower face of the cover film 40. Further, the terminal 46 protrudes downward, i.e., protrudes toward the piezoelectric sheet 41.

A terminal 46 and a corresponding land 36 are bonded to each other with a conductive member 47. As the conductive member 47, there may be adopted a conductive bonding material such as an epoxy-base thermosetting adhesive, a solder, etc.

An individual electrode 35 is electrically connected through a land 36 to a terminal 46 of the FPC 50, and further electrically connected through a wiring 48 to the driver IC 80. Thereby, for every pressure chamber 10, a potential of a corresponding individual electrode 35 can be controlled.

Next, driving methods of the actuator unit 21 will be described.

In the actuator unit 21, the piezoelectric sheet 41 is polarized in its thickness direction. Thus, the actuator unit 21 has a so-called unimorph structure in which the piezoelectric sheet 41 disposed above the common electrode 34 constitutes a layer including active portions while the piezoelectric sheets 42 to 44 disposed thereunder constitute inactive layers.

When an individual electrode 35 is set at a positive or negative predetermined potential in a state where an electric field and polarization occur in the same direction, a portion of the piezoelectric sheet 41 sandwiched between the individual electrode 35 and the common electrode 34, which means an active portion, contracts in a plane direction of the sheets by a transversal piezoelectric effect. Since the piezoelectric sheets 42 to 44 are not affected by the electric field, they do not displace by themselves. As a result, the piezoelectric sheet 41 and the other piezoelectric sheets 42 to 44 exhibit unequal distortion in the plane direction of the sheets, so that the piezoelectric sheet 41 to 44 as a whole deform downward into a convex shape (which is called a unimorph deformation). At this time, the piezoelectric sheets 41 to 44 deform into a convex shape toward a corresponding pressure chamber 10, because a bottom face of the actuator unit 21 is secured to an upper face of the wall 22a of the cavity plate 22 which defines pressure chambers 10, as shown in FIG. 6A. Consequently, the volume of the pressure chamber 10 is reduced, so that ink contained in the pressure chamber 10 receives raised pressure and therefore is ejected through a corresponding nozzle 8.

Then, when the individual electrode 35 is reset at the same potential as that of the common electrode 34, the piezoelectric sheets 41 to 44 restore their original flat shape and the pressure chamber 10 restores its original volume. Thereby, ink reserved in the reservoir unit 71 is supplied through the sub manifold channel 5a into the pressure chamber 10.

In another possible driving method, the individual electrodes 35 are in advance maintained at a potential different from that of the common electrode 34, so that the piezoelectric sheets 41 to 44 protrude toward the pressure chamber 10 in an initial state. Then, upon every ejection request, the individual electrode 35 is set at the same potential as that of the common electrode 34, to make the piezoelectric sheets 41 to 43 into a flat shape. Thereafter, at a predetermined timing, the individual electrode 35 is again set at the potential different from that of the common electrode 34.

In this case, at a time when the potential of the individual electrode 35 gets equal to the potential of the common electrode 34, a shape of the piezoelectric sheets 41 to 44 changes from an initial shape protruding toward the pressure chamber 10 into a flat shape. Thereby, the pressure chamber 10 increases in volume, and ink is supplied from the sub-manifold channel 5a into the pressure chamber 10. Thereafter, when the potential of the individual electrode 35 and the potential of the common electrode 34 become different from each other, the piezoelectric sheets 41 to 44 restore its initial state, i.e., restore the shape protruding toward the pressure chamber 10. This reduces the volume of the pressure chamber 10 and raises pressure of ink contained in the pressure chamber 10, and thereby the ink is ejected through the nozzle 8.

Next, a method for manufacturing the ink-jet head 1 will be described with reference to FIGS. 7 and 8.

Figure 7:
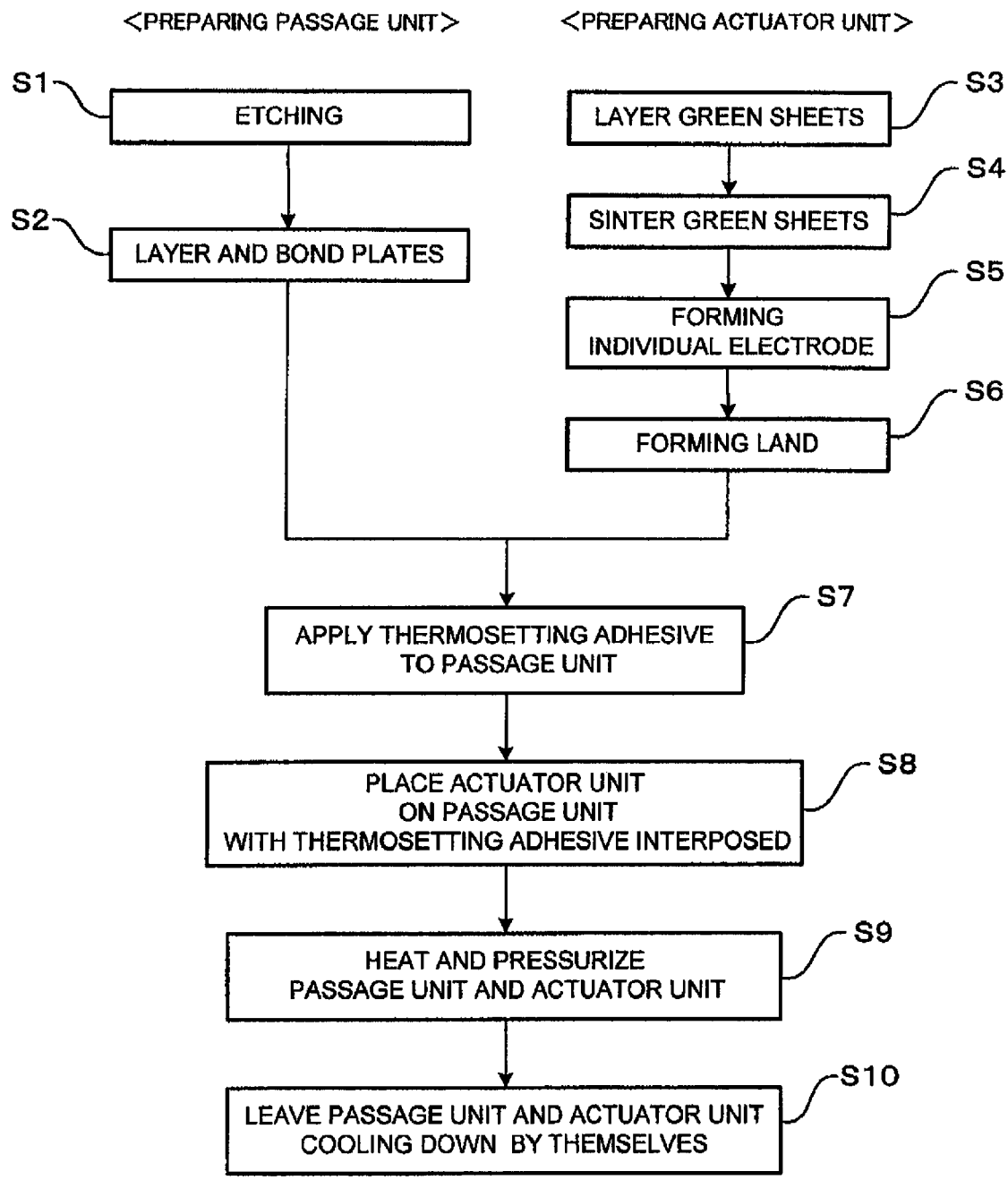
FIG. 7 is a flowchart showing a step of manufacturing the head main body.

FIG. 7 shows a method for manufacturing the head main body 70. In order to manufacture the head main body 70, the passage unit 4 and the actuator unit 21 are separately prepared, and then bonded to each other. A step of preparing the passage unit and a step of preparing the actuator unit are independent of each other. Either one of the steps may precede the other, and alternatively these steps may be performed concurrently.

Preparing the passage unit 4 will be described. First, each of the plates 22 to 30 is subjected to etching using a patterned photoresist as a mask, thereby forming in each of the plates 22 to 30 openings shown in FIG. 5 (S1). Subsequently, the plates 22 to 30 are put in layers with interposition of an epoxy-base thermosetting adhesive while positioned so as to form the individual ink passages 7. Then, the plates 22 to 30 thus layered are heated to a curing temperature of the thermosetting adhesive or higher, and in this state pressurized. Thereby, the thermosetting adhesive is cured, so that the plates 22 to 30 are bonded to one another (S2). The passage unit 4 shown in FIG. 5 is prepared in this manner.

Preparing the actuator unit 21 will be described. First, four green sheets of a ceramic material are prepared. The green sheets are formed considering in advance an estimated amount of contraction which will be caused by sintering. On one of the green sheets, a conductive paste is screen-printed in a pattern of the common electrode 34. Then, the green sheet on which the conductive paste is printed in the pattern of the common electrode 34 is layered under the green sheet on which no conductive paste is printed, and the remaining two green sheets on which no conductive paste is printed are further layered under the green sheet on which the conductive paste is printed in the pattern of the common electrode 34 (S3).

The layered body thus obtained in S3 is degreased like known ceramics, and sintered at a predetermined temperature (S4). Thereby, the four green sheets are transformed into the piezoelectric sheets 41 to 44, and the conductive paste is transformed into the common electrode 34. Thereafter, on the uppermost piezoelectric sheet 41, a conductive paste is screen printed in a pattern of the individual electrodes 35. Then, the layered body is heat-treated, to sinter the conductive paste printed on the piezoelectric sheet 41, thus forming the individual electrodes 35 (S5).

Subsequently, at an end of an auxiliary electrode portion 35b of each individual electrode 35, gold including grass frits which has the same thickness as that of the individual electrode 35 is printed in such a pattern that a hole having the same shape as that of the hole 36a appears. Then, on the gold including grass frits thus printed, gold including grass frits having the same pattern and the same thickness as described above is further printed twice. As a result, a land 36 whose thickness is substantially three times the thickness of the individual electrode 35 is formed (S6). The actuator unit 21 shown in FIG. 6A is prepared in this manner.

Next, bonding the actuator unit 21 to the passage unit 4 will be described. First, by means of a bar coater, an epoxy-base thermosetting adhesive having a curing temperature of 80 degrees C. or higher is applied to regions of an upper face of the passage unit 4 where the actuator units 21 will be bonded (see FIG. 3) (S7). The thermosetting adhesive is applied to an upper face of the wall 22a of the cavity plate 22 which defines the pressure chambers 10. The thermosetting adhesive used may be a two-liquid mixed type one.

Then, while positioning such that the individual electrodes 35 correspond to the respective pressure chambers 10, each actuator unit 21 is placed onto a portion of the upper face of the passage unit 4 to which the thermosetting adhesive is applied (S8). At this time, the wall 22a supports the actuator unit 21. This positioning is based on positioning marks (not shown) which have been formed beforehand in the passage unit 4 and the actuator unit 21 during S1 to S6.

Then, by means of a heater/pressurizer (not shown), a layered body of the passage unit 4 and the actuator unit 21 is heated to a curing temperature of the thermosetting adhesive or higher and in this state pressurized (S9). Thereby, the actuator unit 21 is fixed onto the passage unit 4 so as to close the openings of the pressure chambers 10. Then, the layered body is taken out of the heater/pressurizer, and left cooling down by itself (S10). In this manner, the actuator unit 21 is bonded onto the passage unit 4, and the head main body 70 including the passage unit 4 and the actuator unit 21 is prepared.

Figure 8:
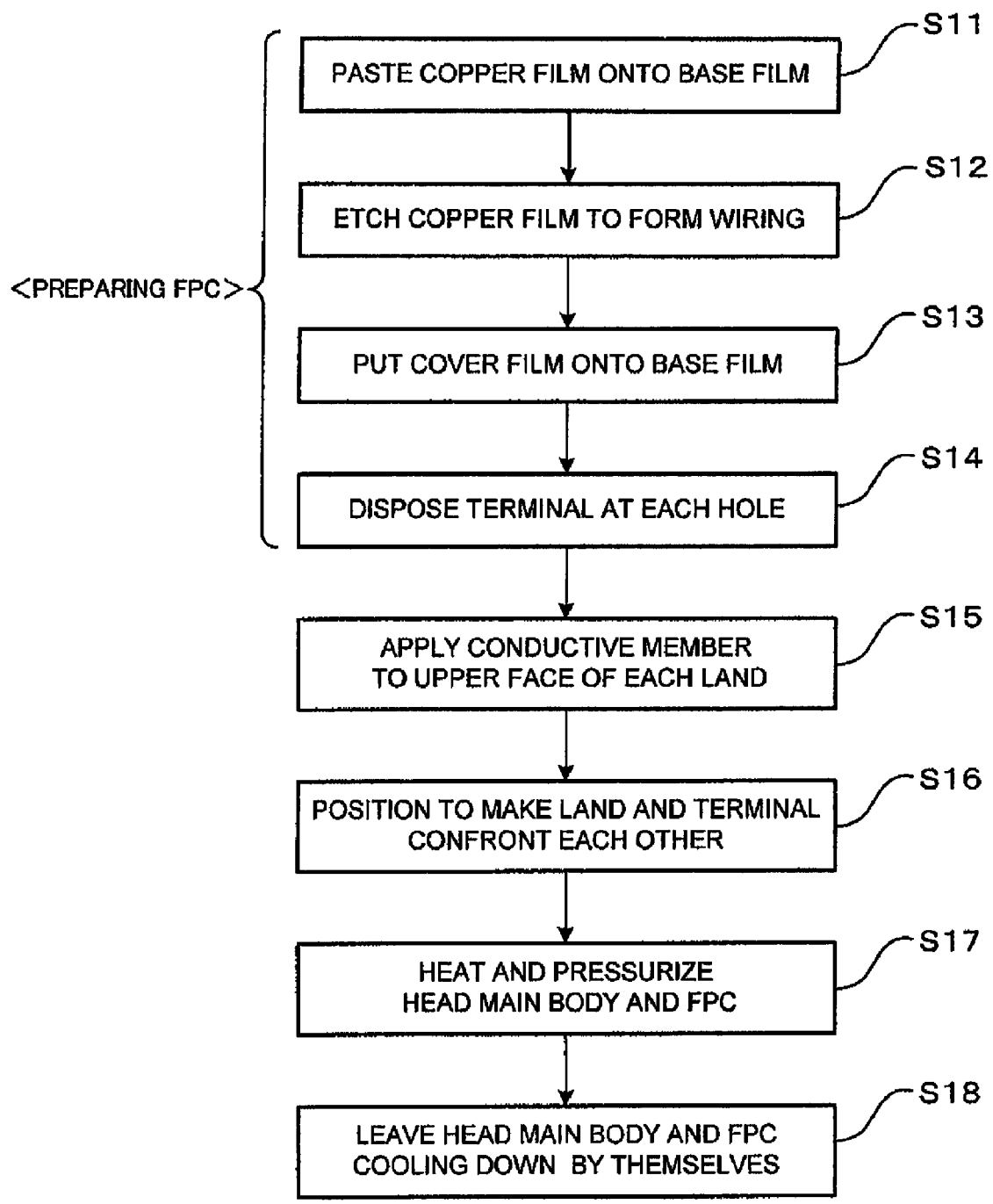
FIG. 8 is a flowchart showing steps of preparing the FPC and bonding this FPC to the head main body.

FIG. 8 shows steps of preparing the FPC 50 and bonding this FPC 50 to the head main body 70.

In order to prepare the FPC 50, first, a copper film is pasted on a whole of one face of the base film 49 using an adhesive (S11). Then, a photoresist is printed in a pattern on a surface of the copper film, and the copper film masked by the photoresist is etched to thereby remove portions of the copper film which do not form the wirings 48. Then, the photoresist is removed (S12). Subsequently, by means of an adhesive, the cover film 40 is attached to the face of the base film having the wirings 48 formed thereon while positioning such that each through hole 45 corresponds to one end of a corresponding wiring 48 (S13). Then, the terminal 46 is provided at the through hole 45 of the cover film 40 such that the terminal 46 is in contact with the one end of the wiring 48 via the through hole 45. The FPC 50 is prepared in this manner.

Figure 9A:
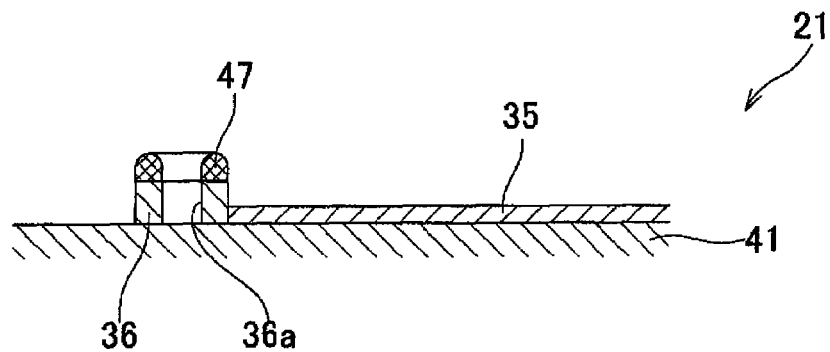
FIG. 9 shows the step of bonding the FPC to the head main body.
Figure 9B:
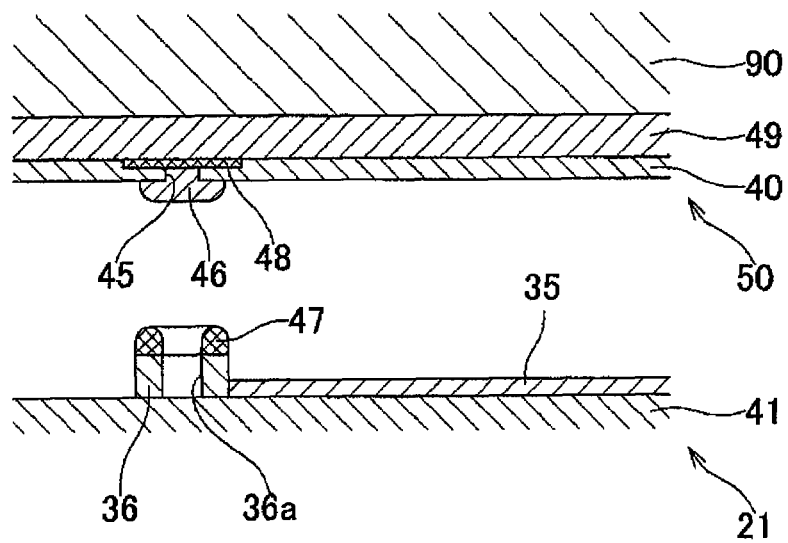
Figure 9C:
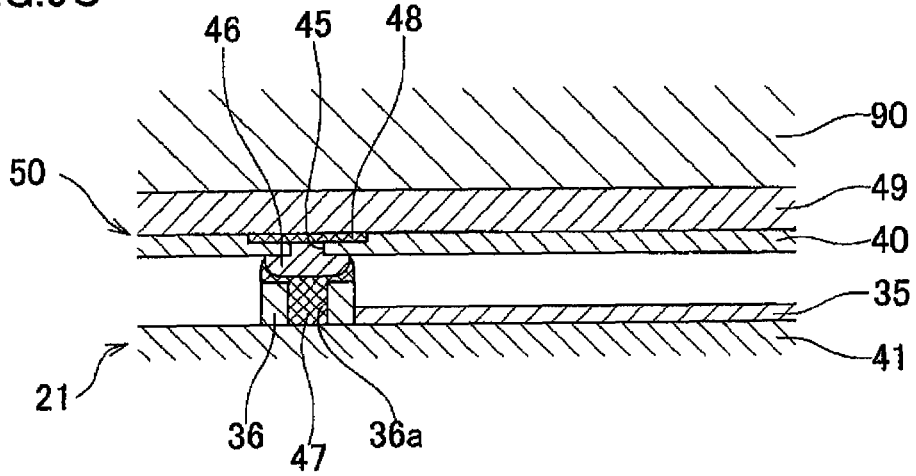

Next, bonding the FPC 50 to the head main body 70 will be described. First, as shown in FIG. 9A, a conductive member 47 is applied to an upper face of each land 36 of the actuator unit 21 (S15). Then, as shown in FIG. 9B, the FPC 50 which is supported on a lower face of a jig 90 is positioned relative to the head main body 70 such that each land 36 confronts a corresponding terminal 46 (S16). As shown in FIG. 9C, the jig 90 is moved down to press the terminal 46 onto the land 36 while heating the FPC 50 and the head main body 70 by means of a heater (not shown) (S17). Thereby, the terminal 46 and the land 36 are temporarily bonded to each other with the conductive member 47 being melted.

When the terminal 46 is pressed onto the land 36 in S17, the conductive member 47 placed on the land 36 hardly spreads around the land 36 but flows into the hole 36a of the land 36, as shown in FIG. 9C.

Then, the temporarily-bonded FPC 50 and the head main body 70 are left cooling down by themselves (S18). In this manner, the FPC 50 is bonded to the head main body 70. Further, through a step of bonding the base block 71, the ink-jet head 1 is completed.

As thus far described above, in the ink-jet head 1 of the present invention, at the time when the land 36 and the terminal 46 are bonded to each other with the conductive member 47 which is applied to a top face of the land 36, the conductive member 47 flows into the hole 36a of the land 36. Therefore, even if a little too much conductive member 47 is applied, it does not so easily overflow around the land 36. This leads to suppression of a short circuit which may otherwise be caused by the conductive member 47 coming into contact with other individual electrodes 35.

Moreover, since a height of the land 36 from the upper face of the piezoelectric sheet 41 is larger than a height of the individual electrode 35 from the upper face of the piezoelectric sheet 41, the wiring 48 of the FPC 50 can be kept from coming into contact with other lands 36 or individual electrodes 35. In addition, the wiring 48 is spaced from the individual electrode 35 at a larger distance. Accordingly, even if the cover film 40 is not provided on the FPC 50, the wiring 48 is not so easily brought into contact with the individual electrode 35. Thus, the cover film 40 can be omitted, to reduce costs of manufacturing the FPC 50. Besides, a distance between the top face of the land 36 and the upper face of the piezoelectric sheet 41 is relatively large. Accordingly, even if the conductive member 47 flows out from the top face to a side face of the land 36, the conductive member 47 does not so easily reach the upper face of the piezoelectric sheet 41. Therefore, the conductive member 47 does not spread over the piezoelectric sheet 41.

The hole 36a of the land 36 is formed so as to extend in a direction perpendicular to the upper face of the piezoelectric sheet 41. This makes it easy to form the hole 36 by screen printing. To be more specific, the land 36 having the hole 36a can be formed merely by overlaying three times gold including glass frits in the same pattern. If an extension direction of the hole 36a was inclined with respect to the direction perpendicular to the upper face of the piezoelectric sheet 41, the screen-printing could not adopt the same pattern but instead requires different patterns and delicate positioning.

The hole 36a penetrates through the land 36, and a depth of the hole 36a is identical to the height of the land 36. This makes it more difficult that the conductive member 47 spreads around the land 36.

Figure 10:
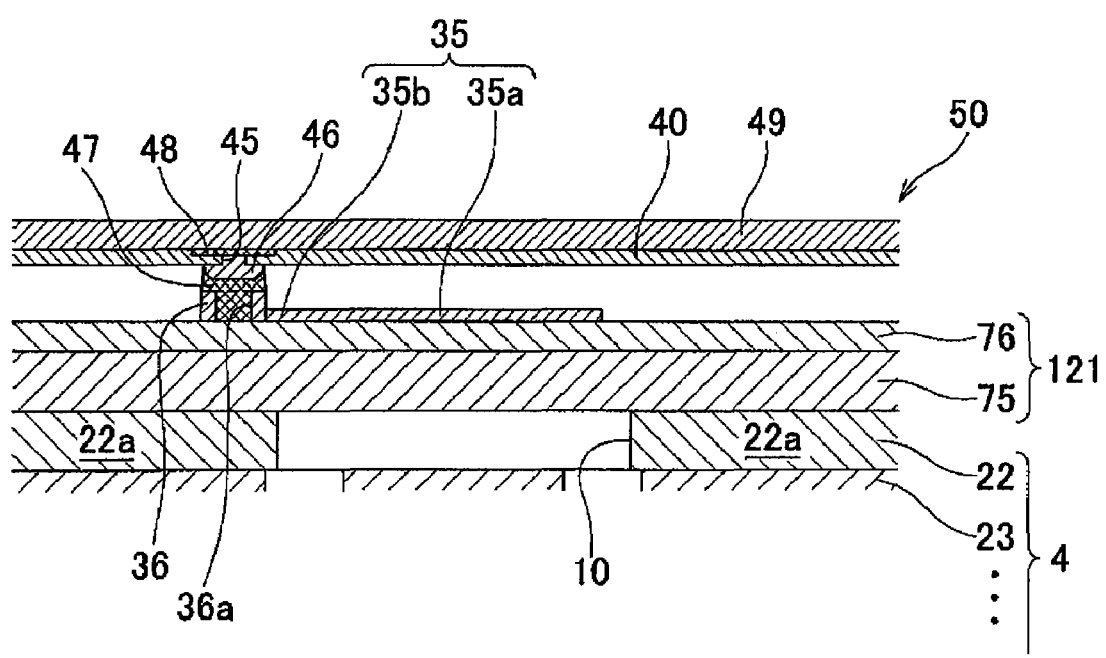
FIG. 10 is a local sectional view showing a modification of the actuator unit.

Next, with reference to FIG. 10, a description will be given to a modification of the actuator unit included in the ink-jet head of the present invention. The same elements as those of the above-described embodiment are denoted by common reference numerals without a specific description thereof.

An actuator unit 121 of this modification includes a diaphragm 75 that is bonded to an upper face of a passage unit 4, and a piezoelectric layer 76 that is formed on an upper face of the diaphragm 75. Formed on an upper face of the piezoelectric layer 76 are individual electrodes 35 and the lands 36 in the same arrangement pattern as described above. The diaphragm 75 is conductive and grounded in a not-shown region. That is, the diaphragm 75 functions as a common electrode, too.

When an individual electrode 35 is set at a positive or negative predetermined potential in a state where an electric field and polarization occur in the same direction, a portion of the piezoelectric layer 76 sandwiched between the individual electrode 35 and the diaphragm 75, which means an active portion, contracts in a plane direction of the piezoelectric layer 76 by a transversal piezoelectric effect. Since the diaphragm 75 is not affected by the electric fields it does not displace by itself. As a result, the piezoelectric layer 76 and the diaphragm 75 exhibit unequal distortion in their plane direction, so that the piezoelectric layer 76 and the diaphragm 75 deform together downward into a convex shape (which is called a unimorph deformation). At this time, the piezoelectric layer 76 and the diaphragm 75 deform into a convex shape toward a corresponding pressure chamber 10, because a bottom face of the diaphragm 75 is secured to an upper face of a wall 22a of a cavity plate 22 which defines pressure chambers 10, as shown in FIG. 10. Consequently, the volume of the pressure chamber 10 is reduced, so that ink contained in the pressure chamber 10 receives raised pressure and therefore is ejected through a corresponding nozzle 8.

Then, when the individual electrode 35 is reset at the same potential as that of the diaphragm 75, the piezoelectric layer 76 and the diaphragm 75 restore their original flat shape and the pressure chamber 10 restores its original volume. Thereby, ink reserved in a reservoir unit 71 is supplied through a sub manifold channel 5a into the pressure chamber 10.

In another possible driving method, the individual electrodes 35 are in advance maintained at a potential different from that of the diaphragm 75, so that the piezoelectric layer 76 and the diaphragm 75 protrude toward the pressure chamber 10 in an initial state. Then, upon every ejection request, the individual electrode 35 is set at the same potential as that of the diaphragm 75, to make the piezoelectric layer 76 and the diaphragm 75 into a flat shape. Thereafter, at a predetermined timing, the individual electrode 35 is again set at the potential different from that of the diaphragm 75.

In this case, at a time when the potential of the individual electrode 35 gets equal to the potential of the diaphragm 75, a shape of the piezoelectric layer 76 and the diaphragm 75 changes from an initial shape protruding toward the pressure chamber 10 into a flat shape. Thereby, the pressure chamber 10 increases in volume, and ink is supplied from a submanifold channel 5a into the pressure chamber 10. Thereafter, when the potential of the individual electrode 35 and the potential of the diaphragm become different from each other, the piezoelectric layer 76 and the diaphragm 75 restore its initial state, i.e., restore the shape protruding toward the pressure chamber 10. This reduces the volume of the pressure chamber 10 and raises pressure of ink contained in the pressure chamber 10, and thereby the ink is ejected through the nozzle 8.

A method for preparing the actuator unit 121 will be described.

First, by means of an aerosol deposition, the piezoelectric layer 76 is formed on the diaphragm 75 having the same shape as that of the plates 22 to 30 of the passage unit 4. To be more specific, the piezoelectric layer 76 is formed by jetting from an aerosol generator (not shown) aerosol gas which is a mixture of carrier gas and a piezoelectric material in the form of ultra-fine particles, so that the aerosol gas is deposited on a plane of the diaphragm 75. The piezoelectric layer 76 is thereby formed. In order to form the piezoelectric layer 76 on the diaphragm 75, it may be possible to employ other known methods instead of the aerosol deposition, such as a sputtering, a chemical vapor deposition, a hydrothermal crystallization, and the like. Then, by means of a screen-printing, a sputtering, a vapor deposition or the like, the individual electrodes 35 and the lands 36 are formed on a face of the piezoelectric layer 76 opposite to its face facing the diaphragm 75. The actuator unit 121 is prepared in this manner.

Next, an ink-jet head according to a second embodiment of the present invention will be described with reference to FIGS. 11A and 11B. The same elements as those of the above-described embodiment are denoted by common reference numerals without a specific description thereof.

An ink-jet head of the second embodiment has substantially the same construction as that of the ink-jet head 1 of the first embodiment except that a land 236 of an actuator unit 221 has a shape slightly different from the shape of the land 36 of the first embodiment.

The land 236 has a hole 236a and a groove 237. Similarly to the hole 36a of the first embodiment, the hole 236a is formed at a center of the land 236 and penetrates through the land 236 in a thickness direction. The groove 237 communicates with the hole 236a and opens in a left side face of the land 236 in FIGS. 11A and 11B. The groove 237 opening in the side face of the land 236 faces away from an individual electrode 35 which is electrically connected to this land 236 and faces toward, among other individual electrodes 35 neighboring this land 236, the most remote individual electrode 35. Referring to FIG. 11B, for example, the groove 237 of the rightmost land 236 opens toward the leftmost individual electrode 35 which is most remote from this rightmost land 236. The hole 236a can communicate with the outside via the groove 237. The land 236 has a U-like shape in a plan view. A width of the groove 237 is the same as a diameter of the hole 236a, and a height of the groove 237 is the same as a height of the land 236. The groove 237 penetrates through the land 236 in the thickness direction, and opens in top and bottom faces of the land 236. A bottom of the hole 236a and the groove 237 is closed with the piezoelectric sheet 41, and a top thereof is left opened.

Bonding a terminal 46 of an FPC 50 to the land 236 of the actuator unit 221 will be described.

First, similarly to in the first embodiment, a conductive member 247 is applied to a top face of each land 236, and then the FPC 50 is positioned such that each land 236 confronts a corresponding terminal 46. The terminal 46 is pressed onto the land 236 while the FPC 50 and a head main body including the actuator unit 221 are heated. Thereby, the terminal 46 and the land 236 are temporarily bonded to each other with the conductive member 247 being melted.

Figure 11A:
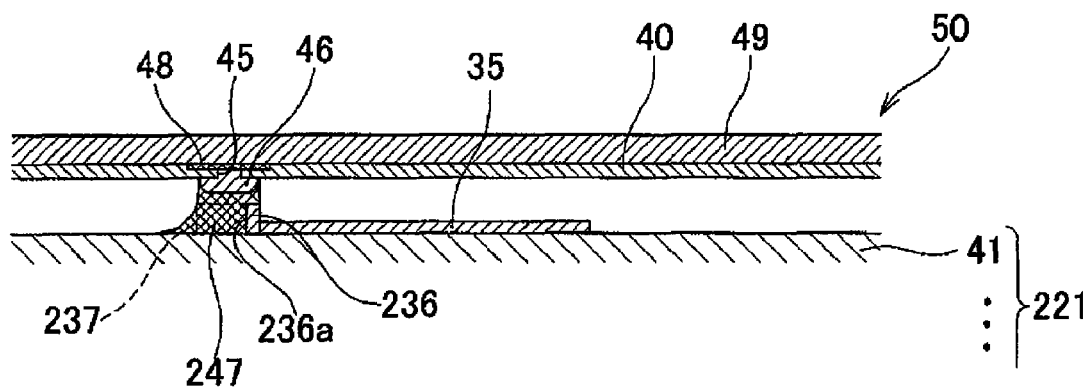
FIG. 11A is a local sectional view showing a bonding between an actuator unit and an FPC that are included in an ink-jet head according to a second embodiment of the present invention.
Figure 11B:
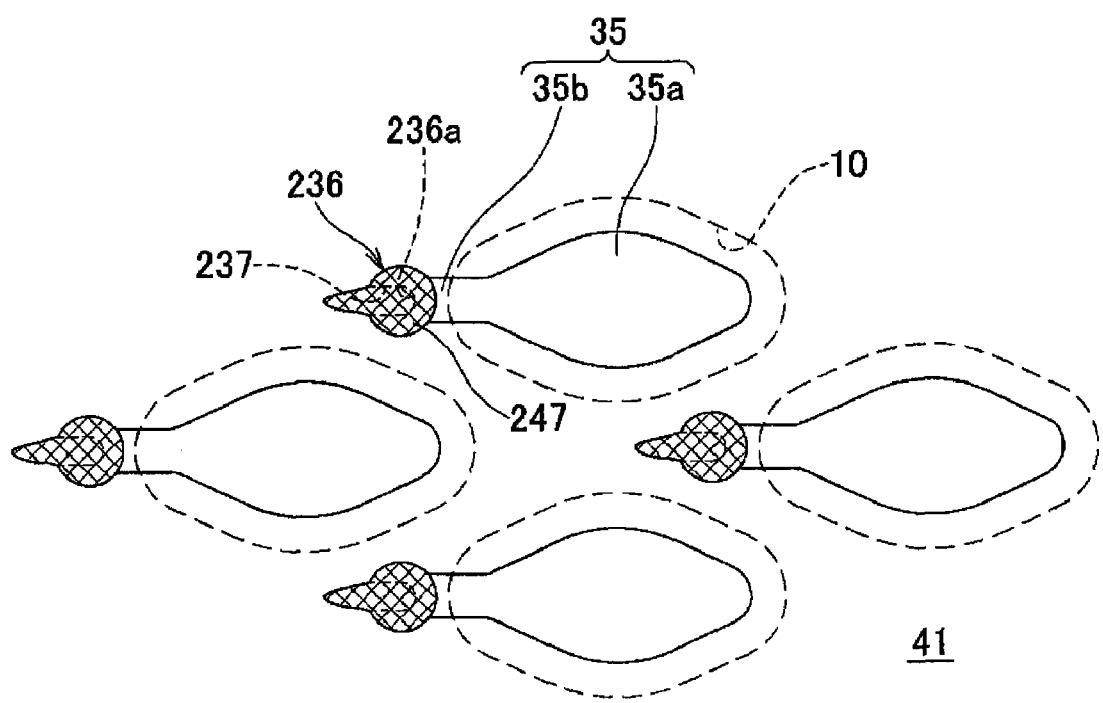
FIG. 11B is a local plan view of the actuator unit of FIG. 11A.

When the terminal 46 is pressed onto the land 236 during this temporary bonding, the conductive member 247 placed on the land 236 flows into the hole 236a and the grooves 237, and slightly overflows through the groove 237 on the left side of the land 236, as shown in FIGS. 11A and 11B.

Thereafter, the temporarily-bonded FPC 50 and the head main body including the actuator unit 221 are left cooling down by themselves. In this manner, the terminal 46 of the FPC 50 is bonded to the land 236 of the actuator unit 221.

In the ink-jet head according to the second embodiment described above, the land 236 has the hole 236a. Therefore, substantially the same effects as those of the head of the first embodiment can be obtained. In addition, the land 236 has, on its side face, the groove 237 facing away from the individual electrode 35 that is electrically connected to this land 236. Consequently, even if the conductive member 247 flows through the hole 236a and overflows from the groove 237, the conductive member 247 is not brought into contact with the individual electrode 35 that is connected to this land 236. This can prevent occurrence of irregularity in rigidity of the respective individual electrodes 35, and therefore deformation properties of active portions of the piezoelectric sheet 41 are stabilized.

The individual electrodes 35 are arranged in a matrix, and the groove 237 of the land 236 faces toward, among other individual electrodes 35 neighboring this land 236, an individual electrode 35 most remote from this land 236, as shown in FIG. 11B. With this construction, even if the conductive member 247 flows through the hole 236a and overflows from the groove 237 onto the piezoelectric sheet 41, the conductive member 247 is not brought into contact with other individual electrodes that neighbor this land 236. This leads to suppression of a short circuit which may otherwise be caused by the conductive member 247 coming into contact with other individual electrodes 35.

Here, one land 236 is spaced from, among other individual electrodes 35 neighboring this land 236, the most remote individual electrode 35 at a relatively large distance. For example, referring to FIG. 11B, the rightmost land 236 is spaced from the leftmost individual electrode 35 at a relatively large distance. Therefore, the conductive member 247 applied on the rightmost land 236 can rarely come into contact with the leftmost individual electrode 35.

Next, an ink-jet head according to a third embodiment of the present invention will be described with reference to FIGS. 12A and 12B. The same elements as those of the above-described embodiments are denoted by common reference numerals without a specific description thereof.

An ink-jet head of the third embodiment has substantially the same construction as that of the ink-jet head 1 of the first embodiment, except that a land 336 of an actuator unit 321 has a shape slightly different from the shape of the land 36 of the first embodiment and from the shape of the land 236 of the second embodiment, and also except that an insulator 340 is disposed between the land 336 and a piezoelectric sheet 41.

The insulator 340 is made of glass having a lower permittivity than that of the piezoelectric sheet 41. As shown in FIGS. 12A and 12B, the insulator 340 is positioned within a region which is opposed to the land 336 in a plan view such that the insulator 340 is in contact with an end of an auxiliary electrode portion 35b.

A shape of the insulator 340 is substantially the same as the shape of the land 236 of the second embodiment. That is, the insulator 340 has a hole 340a and a groove 341. The hole 340a is formed at a center of the insulator 340 and penetrates through the insulator 340 in a thickness direction of the piezoelectric sheet 41. The groove 341 communicates with the hole 340a and opens in a left side face of the insulator 340 in FIGS. 12A and 12B. The hole 340a can communicate with the outside via the groove 341. The insulator 340 has a U-like shape in a plan view. A width of the groove 341 is the same as a diameter of the hole 340a, and a height of the groove 341 is the same as a height of the insulator 340. The groove 341 penetrates through the insulator 340 through its thickness, and opens in top and bottom faces of the insulator 340. A bottom of the hole 340a and the groove 341 is closed with the piezoelectric sheet 41, and a top thereof is left opened.

Figure 12A:
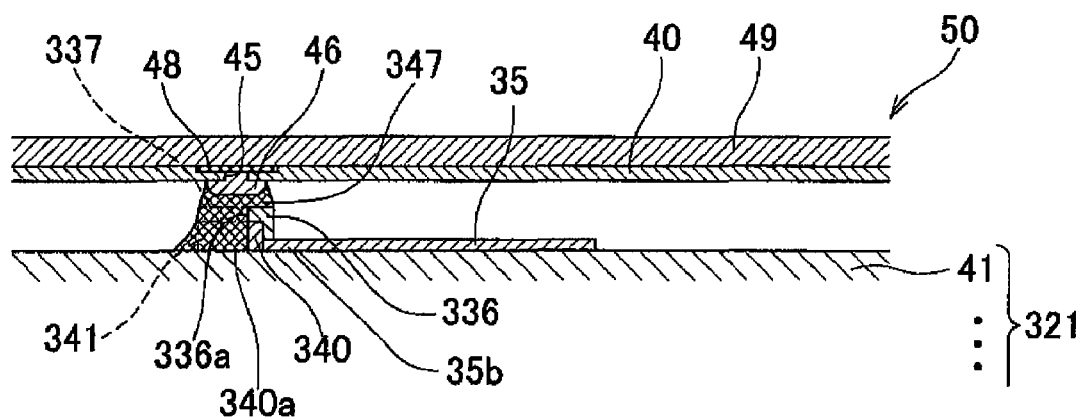
FIG. 12A is a local sectional view showing a bonding between an actuator unit and an FPC that are included in an ink-jet head according to a third embodiment of the present invention.

As shown in FIG. 12A, the land 336 is disposed on the insulator 340, and has an L-shaped section with its end protruding downward into contact with the auxiliary electrode portion 35b of the individual electrode 35.

The land 336 has a hole 336a and a groove 337. The hole 336a is formed at a center of the land 336 and penetrates through the land 336 in a thickness direction. The groove 337 communicates with the hole 336a and opens in a left side face of the land 336 in FIGS. 12A and 12B. In a plan view, the hole 336a corresponds to the hole 340a of the insulator 340, and the groove 337 corresponds to the groove 341 of the insulator 340. That is, in a plan view, the hole 340a and the hole 336a have the same shape and the same size, and are disposed to overlap each other, while the groove 341 and the groove 337 have the same shape and the same size, and are disposed to overlap each other. A width of the groove 337 is the same as a diameter of the hole 336a, and a height of the groove 337 is the same as a height of the land 336. The groove 337 penetrates through the land 336 in its thickness, and opens in top and bottom faces of the land 336. The hole 336a and the groove 337 of the land 336 communicate with each other, and the hole 340a and the groove 341 of the insulator 340 communicate with each other. The hole 336a and the hole 340a can communicate with the outside via the grooves 337 and 341, respectively.

Bonding a terminal 46 of an FPC 50 to the land 336 of the actuator unit 321 will be described.

First, similarly to in the first and second embodiments, a conductive member 347 is applied to a top face of each land 336, and then the FPC 50 is positioned such that each land 336 confronts a corresponding terminal 46. The terminal 46 is pressed onto the land 336 while the FPC 50 and a head main body including the actuator unit 321 are heated. Thereby, the terminal 46 and the land 336 are temporarily bonded to each other with the conductive member 347 being melted.

Figure 12B:
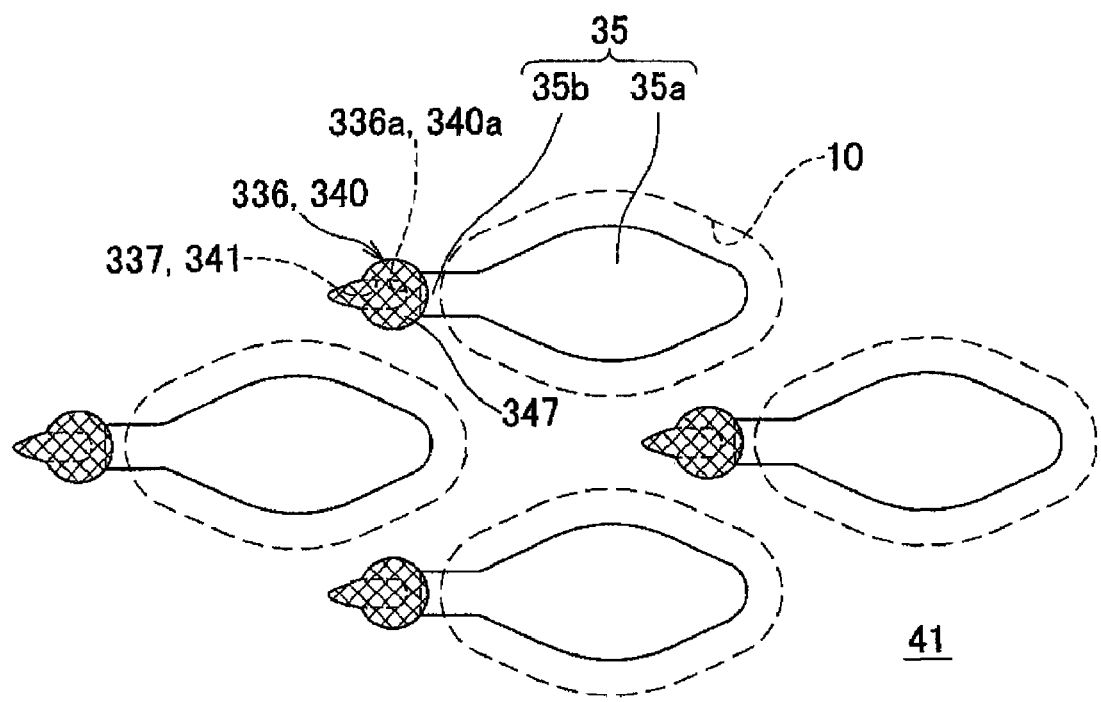
FIG. 12B is a local plan view of the actuator unit of FIG. 12A.

When the terminal 46 is pressed onto the land 336 during this temporary bonding, the conductive member 347 placed on the land 336 flows into the holes and grooves 336a, 340a, 337, and 341, and some of it overflows through the groove 341 on the left side of the insulator 340, as shown in FIGS. 12A and 12B.

Thereafter, the temporarily-bonded FPC 50 and the head main body including the actuator unit 321 are left cooling down. In this manner, the terminal 46 of the FPC 50 is bonded to the land 336 of the actuator unit 321.

In the ink-jet head according to the third embodiment described above, the land 336 has the hole 336a and the groove 337. Therefore, substantially the same effects as those of the head of the second embodiment can be obtained. In addition, since the insulator 340 is disposed between the land 336 and the piezoelectric sheet 41, a thickness of the insulator 340 spaces the land 336 from the piezoelectric sheet 41, to thereby decrease an electric field strength of a region of the piezoelectric sheet 41 opposed to the land 336. To be more specific, the electric field strength is calculated out based upon "a potential difference between the land 336 and the common electrode 34/a distance between the land 36 and the common electrode 34". In this embodiment, as compared with in the first and second embodiments, a value of "a distance between a land and a common electrode" is increased by the thickness of the insulator 340, so that the electric field strength is decreased. Accordingly, the region of the piezoelectric sheet 41 opposed to the land 336 exhibits a lower degree of deformation, thus suppressing a mechanical crosstalk. Since the mechanical crosstalk is suppressed, a plane area of the land 336 can be enlarged for the purpose of increasing an area in which the terminal 46 and the land 336 are bonded. This can improve bond strength between the terminal 46 of the FPC 50 and the land 336. Moreover, a parasitic capacitance formed between the land 336 and the common electrode 34 becomes smaller and as a consequence an electrostatic energy stored in this parasitic capacitance becomes smaller, too. Therefore, electric power involved in driving the actuator unit 321 can be reduced.

Since a permittivity of the insulator 340 is lower than a permittivity of the piezoelectric sheet 41, the electrostatic energy stored in the parasitic capacitance that is formed between the land 336 and the common electrode 34 becomes still smaller. Therefore, electric power involved in driving the actuator unit 321 can further be reduced.

Since the insulator 340 is disposed within the region opposed to the land 336, the individual electrodes 35 and the lands 336 can be arranged at a high density.

The insulator 340 has the hole 340a which communicates with the hole. 336a of the land 336. Accordingly, when the terminal 46 is pressed onto the land 336, the conductive member 347 placed on the land 336 flows also into the hole 340a of the insulator 340. This can efficiently prevent the conductive member 347 from overflowing around the land 336.

The hole 36a of the land 36, the hole 236a of the land 236, and the hole 336a of the land 336 may not necessarily penetrate through these lands, and may not necessarily extend in the direction perpendicular to the upper face of the piezoelectric sheet 41. In addition, it is not always necessary that the holes 36a, 236a, and 336a are formed at centers of the lands 36, 236, and 336, respectively.

A material of the insulator 340 of the third embodiment is not limited to glass having a lower permittivity than that of the piezoelectric sheet 41, but may be another material, as long as the material is conductive.

It is not always necessary that the insulator 340 of the third embodiment is formed within the region opposed to the land 336. For example, it may be possible that the insulator 340 has a planar shape slightly larger than that of the land 336 so that the insulator 340 goes out of the region opposed to the land 336.

The insulator 340 of the third embodiment may not have the hole 340a and the groove 341.

In the second and third embodiments, the grooves 237 and 337 of the lands 236 and 336 may not penetrate through these lands 236 and 336 in their thickness direction. For example, it may also be possible that the grooves 237 and 337 do not open in the top faces of the lands 236 and 336 but are formed like tunnels inside the lands 236 and 336.

In the second and third embodiment, the grooves 237 and 337 of the lands 236 and 336 open toward, among other individual electrodes 35 neighboring the lands 236 and 336, the most remote individual electrode 35. However, they may open toward various directions as long as they face away from the individual electrodes 35 that are electrically connected to these lands 236 and 336.

In the first and second embodiments, the lands 36 and 236 may be disposed on the auxiliary electrode portions 35b of the individual electrodes 35. In the third embodiment, it may be possible that the insulator 340 is disposed on the auxiliary electrode portion 35b of the individual electrode 35 and further the land 336 is formed on this insulator 340 such that the land 336 may be in contact with the auxiliary electrode portion 35b.

It may not always necessary that the common electrode 34 is formed between the piezoelectric sheets 41 and 42 throughout a surface of each of these sheets.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. An ink-jet head comprising:
a piezoelectric actuator comprising a piezoelectric layer,
a plurality of individual electrodes respectively corresponding to ink ejection channels and formed on a surface of the piezoelectric layer,
a plurality of lands formed on the surface of the piezoelectric layer or the surface of the individual electrodes so as to be electrically connected to the respective individual electrodes, and a common electrode opposed to the individual electrodes with the piezoelectric layer being interposed therebetween;
a wiring board comprising a plurality of terminals respectively corresponding to the plurality of lands, and a plurality of wirings respectively corresponding to the plurality of terminals; and
a conductive member providing electrical connection between the individual electrodes of the piezoelectric actuator and the terminals of the wiring board via the plurality of lands,
wherein a height of each of the plurality of lands from the surface of the piezoelectric layer is larger than a height of the individual electrode from the surface of the piezoelectric layer,
each of the plurality of lands has a hole opening in its top face which is remote from the piezoelectric layer, and an inner surface of the hole opening of each land contains at least a portion of the conductive member, and
each of the plurality of terminals formed on the wiring board is physically and electrically connected to a corresponding one of the plurality of lands of the piezoelectric actuator, through the conductive member at the top of the corresponding one of the plurality of lands, and the conductive member is positioned in the hole opening of the corresponding one of the plurality of lands.

2. The ink-jet head according to claim 1, wherein the hole extends in a direction perpendicular to the surface of the piezoelectric layer.

3. The ink-jet head according to claim 1, wherein the hole penetrates through one of the plurality of lands.

4. The ink-jet head according to claim 1, wherein each one of a plurality of insulators is sandwiched between a corresponding single one of the plurality of lands and the piezoelectric layer.

5. The ink-jet head according to claim 4, wherein a permittivity of the insulator is lower than a permittivity of the piezoelectric layer.

6. An ink-jet head comprising:
a piezoelectric actuator including a piezoelectric layer,
a plurality of individual electrodes respectively corresponding to ink ejection channels and formed on a surface of the piezoelectric layer,
a plurality of lands formed on the surface of the piezoelectric layer or the surface of the individual electrodes so as to be electrically connected to the respective individual electrodes, and
a common electrode opposed to the individual electrodes with the piezoelectric layer being interposed therebetweem; and
a wiring board comprising a plurality of wirings respectively corresponding to the plurality of lands; and
a conductive member providing electrical connection between the individual electrodes of the piezoelectric actuator and the wirings of the wiring board via the plurality of lands,
wherein a height of the land from the surface of the piezoelectric layer is larger than a height of the individual electrode from the surface of the piezoelectric layer, and the land has a hole opening in its top face which is remote from the piezoelectric layer, an inner surface of the hole opening of the land contains the conductive member, and the insulator is formed only within a region opposed to the land.

7. An ink-jet head comprising a piezoelectric actuator comprising a piezoelectric layer, a plurality of individual electrodes respectively corresponding to ink ejection channels and formed on a surface of the piezoelectric layer, a plurality of lands formed on the surface of the piezoelectric layers as to be electrically connected to the respective individual electrodes, and a common electrode opposed to the individual electrodes with the piezoelectric layer being interposed therebetween, wherein a height of the land from the surface of the piezoelectric layer is larger than a height of the individual electrode from the surface of the piezoelectric layer, the land has a hole opening in its top face which is remote from the piezoelectric layer, an insulator is disposed between the land and the piezoelectric layer, and the hole penetrates through the land, and the insulator has a hole communicating with the hole.

8. The ink-jet head according to claim 1, wherein each of the plurality of lands further has, on its side face, a groove communicating with the hole and opening away from the individual electrode that is electrically connected to the land.

9. The ink-jet head according to claim 8, wherein: the individual electrodes are arranged in a matrix; and the groove opens toward an individual electrode most remote from one of the plurality of lands having the groove among individual electrodes neighboring the one of the plurality of lands.

10. The ink-jet head according to claim 1, wherein the common electrode is formed throughout a face of the piezoelectric layer opposite to its face having the individual electrodes formed thereon.